United States Patent
Miller et al.

(10) Patent No.: US 7,738,517 B2
(45) Date of Patent: Jun. 15, 2010

(54) SMALL FORM FACTOR TRANSMITTER OPTICAL SUBASSEMBLY (TOSA) HAVING FUNCTIONALITY FOR CONTROLLING THE TEMPERATURE, AND METHODS OF MAKING AND USING THE TOSA

(75) Inventors: Frederick Miller, Santa Clara, CA (US); Eng-Ho Soo, Singapore (SG); Heng Seng Alvin Low, Singapore (SG); Ronald Kaneshiro, Los Altos, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/927,376

(22) Filed: Oct. 29, 2007

(65) Prior Publication Data

US 2009/0110014 A1    Apr. 30, 2009

(51) Int. Cl.
*H01S 3/04* (2006.01)
*H01S 3/00* (2006.01)

(52) U.S. Cl. .................................... 372/34; 372/38.01
(58) Field of Classification Search ................ 372/38.1, 372/38.01, 34, 36
See application file for complete search history.

(56) References Cited

U.S. PATENT DOCUMENTS

| | | | | |
|---|---|---|---|---|
| 5,740,191 | A * | 4/1998 | Kasper et al. | 372/34 |
| 7,200,294 | B2 * | 4/2007 | Uchida | 385/14 |
| 2003/0154726 | A1 * | 8/2003 | Finn et al. | 62/3.7 |
| 2003/0227694 | A1 * | 12/2003 | Hosoya et al. | 359/820 |
| 2005/0135442 | A1 * | 6/2005 | Kropp | 372/34 |
| 2007/0188951 | A1 * | 8/2007 | Crews | 361/56 |
| 2007/0246716 | A1 * | 10/2007 | Bhat et al. | 257/81 |
| 2008/0290353 | A1 * | 11/2008 | Medendorp et al. | 257/89 |

\* cited by examiner

*Primary Examiner*—Minsun Harvey
*Assistant Examiner*—Phillip Nguyen

(57) ABSTRACT

The invention is directed to an OSA having a TO-can-type configuration that is relatively low-cost to manufacture and that has functionality for monitoring and controlling the temperature of the laser diode without the need for additional pins or an increase in the size of the OSA. Thus, the OSA typically includes four or five pins at most. These features of the invention are achieved by providing a thermal control circuit, a temperature sensor and a heater that are integrated along with a laser output power monitor photodiode into the submount assembly substrate.

10 Claims, 6 Drawing Sheets

SMALL FORM FACTOR TRANSMITTER OPTICAL SUBASSEMBLY (TOSA) HAVING FUNCTIONALITY FOR CONTROLLING THE TEMPERATURE, AND METHODS OF MAKING AND USING THE TOSA

TECHNICAL FIELD OF THE INVENTION

The invention relates to optical transceiver modules. More particularly, the invention relates to a small form factor transmitter optical subassembly (TOSA) having functionality for monitoring and controlling the temperature of the laser diode of the TOSA.

BACKGROUND OF THE INVENTION

In optical communications networks, optical transceiver modules are used to transmit and receive optical signals over optical fibers. On the transmit side of the transceiver module, a laser generates amplitude modulated optical signals that represent data, which are then transmitted over an optical fiber coupled to the transceiver module. Various types of semiconductor lasers are typically used for this purpose, including, for example, Vertical Cavity Surface Emitting Lasers (VCSELs) and edge emitting lasers, which may be further divided into subtypes that include Fabry Perot (FP) and Distributed Feedback (DFB) lasers.

On the receive side of the transceiver module, an optics system of the module directs light propagating out of the end of an optical fiber onto an optical detector, which converts the optical energy into electrical energy. The optical detector is typically a semiconductor photodiode device, such as a PIN photodiode, for example. Optical transceiver modules typically include one or more laser diodes on the transmit side for transmitting multiple data signals and one or more photodiodes on the receive side for receiving multiple data signals.

Small form factor optical subassemblies (OSAs) known as transistor outline (TO)-cans are used to hermetically package certain components of optical transceiver modules, such as, for example, laser diodes and photodiodes. In a transmitter OSA (TOSA) TO-can, a die attach process that typically uses epoxy or gold-tin eutectic alloys is performed to attach the laser diode integrated circuit (IC) die to a substrate of a submount assembly of the TOSA. Other components such as discrete electrical components and optical elements are typically also attached to the substrate. After the laser diode IC die and other components have been attached to the substrate, the leads of the die are wire bonded to conductors formed in the submount assembly substrate. These conductors are then wire bonded to pins of the TOSA, which will be used to connect electrical components external to the TOSA to the electrical components inside of the TOSA.

After the wire bonding process has been performed, a cap or lid having a transparent window in it is hermetically sealed to the TO-can header in such a way that the lid encompasses the TOSA components in a hermetically-sealed environment. The pins of the TOSA are then electrically coupled by soldering to conductive traces of a printed circuit board (PCB) that is external to the TOSA. Various other electrical components are mounted on the PCB and electrically connected to the traces of the PCB to provide electrical connections between the electrical components on the PCB and the pins of the TOSA.

Typical low-cost TOSA TO-cans have four or five pins on the submount assembly substrate for power, ground, data, laser output power monitoring, and temperature monitoring. The output power of the laser diode is typically monitored by a discrete photodiode that is placed inside of the TO-can and electrically connected to conductors of the submount assembly substrate. In these types of transceiver modules, the temperature of the laser diode is typically monitored by a sensor that is external to the TOSA. No components are included inside of the TOSA for performing temperature control or temperature monitoring because these types of components require that the TOSA have one or more additional pins. These types of TO-cans also do not include components for performing temperature control or temperature monitoring because of space and power constraints of the TOSA.

In more expensive transceiver modules, the TOSAs have a greater numbers of pins. In these types of transceiver modules, components for laser temperature monitoring and/or temperature control are often included inside of the TOSA. In these types of transceiver modules, the TOSA may include a thermo electric cooler, a resistive heater element or a thermistor for measuring the temperature of the laser diode. Consequently, extra pins are provided on the TOSA for sending control signals to and/or receiving output signals from these components. The operating wavelength of the laser diode can be adjusted to a desired wavelength and maintained at that wavelength by adjusting the temperature of the laser diode. Also, as a laser diode ages, the wavelength of light it produces at a given temperature tends to shift. By monitoring and adjusting the temperature of the laser diode as needed, the operating wavelength of the laser can be maintained at a desired wavelength.

These types of TOSAs sometimes also include an additional photodiode for monitoring the wavelength being produced by the laser diode. TOSAs of this type also sometimes also include a discrete electrostatic discharge (ESD) diode that is wire bonded to the conductors of the submount assembly substrate in parallel with the laser diode to protect the laser diode from ESD events. Alternatively, the ESD diode is sometimes clipped to pins of the TOSA. It would be desirable for a variety of reasons to provide low-cost TO-can OSAs with functionality of the type described above for controlling and/or monitoring the temperature of the laser diode. However, as described above, this additional functionality normally cannot be provided in low-cost OSAs without increasing the OSA pin count and the size of the OSA. Accordingly, a need exists for a low-cost TO-can OSA having functionality for controlling and/or monitoring the temperature of the laser diode, and which does not require an increase in pin count or size of the OSA.

SUMMARY OF THE INVENTION

The invention is directed to a transmitter optical subassembly (TOSA), a method for making the TOSA, and a method for controlling the temperature of a laser diode of a TOSA. The TOSA comprises a submount assembly substrate, at least a thermal controller, temperature sensor and heater integrated in the substrate, a plurality of conductors disposed on or in the substrate, a plurality of electrically conductive pins electrically coupled to one of the plurality of conductors of the substrate, a laser diode die mounted on the substrate and having one or more conductors that are electrically coupled to one or more of the conductors of the substrate, and a monitor photodiode having one or more conductors that are electrically coupled to one or more of the conductors of the substrate. The heater is in close proximity to the laser diode to allow the heater to heat the laser diode based on determinations made by the thermal controller.

The method for making a TOSA comprises providing a submount assembly substrate, integrating at least a thermal controller, a temperature sensor and a heater in the submount assembly substrate, and die attaching and wire bonding a laser diode to a surface of the submount assembly substrate. The TOSA has, at most, five conductive pins for inputting signals to or outputting signals from the TOSA.

The method for controlling the temperature of a laser diode of the TOSA comprises providing a submount assembly substrate having at least a thermal controller, a temperature sensor and a heater integrated therein, and using the thermal controller to control the heater to cause the heater to heat the laser diode die if the thermal controller determines that the temperature of the laser diode die is too low. The TOSA has, at most, five conductive pins for inputting signals to or outputting signals from the TOSA.

These and other features and advantages of the invention will become apparent from the following description, drawings and claims.

DETAILED DESCRIPTION OF THE INVENTION

The invention is directed to an OSA having a TO-can-type configuration that is relatively low-cost to manufacture and that has functionality for monitoring and controlling the temperature of the laser diode without the need for additional pins or an increase in the size of the OSA. Thus, the OSA typically includes four or five pins at most. These features of the invention are achieved by providing a thermal control circuit, a temperature sensor and a heater that are integrated along with a laser output power monitor photodiode into the submount assembly substrate. Preferably, one or more additional components are also integrated into the submount assembly substrate, including an ESD diode for providing ESD protection for the laser diode and a monitoring photodiode for monitoring the output power of the laser diode.

As described above, typically low-cost TOSAs do not include temperature monitoring or temperature control. For these low-cost devices, the costs associated with increasing the TOSA pin count, size and power consumption is not justified by the benefits associated with providing TOSAs with this additional functionality. For this reason, if any temperature monitoring is done, it is done external to the TOSA.

During the normal manufacturing stage, low-cost TO-can TOSAs of the type described above are subjected to many tests. Some of these tests are performed to determine whether the TOSA laser diode operates properly over a wide range of temperatures. For laser diodes that pass these temperature tests, the need for precise temperature monitoring and control inside of the TOSA is reduced or eliminated. Industry standards for these TOSAs require that the performance of the laser diodes be measured over a wide range of temperatures, from relatively cold temperatures to relatively hot temperatures. This type of testing is relatively expensive and time consuming.

In accordance with the invention, it was determined that some of the temperature testing could be eliminated if the temperature range over which the laser diodes used in the TOSAs need to be able to operate is narrowed. It was then determined that using a heater in the TOSA would prevent the laser diodes from seeing the lower end of the temperature range, thereby eliminating the need for testing the performance of the laser diodes over the low end of the temperature range during manufacturing. It was further determined that the heater and temperature control functionality could be included in the TOSA without increasing the pin count or size of the TOSA by integrating these components in the submount assembly substrate. Furthermore, it was also determined that the costs associated with integrating these components in the submount assembly substrate are more than offset by the cost savings achieved by eliminating the low-end temperature testing during the manufacturing process.

Figure 1:
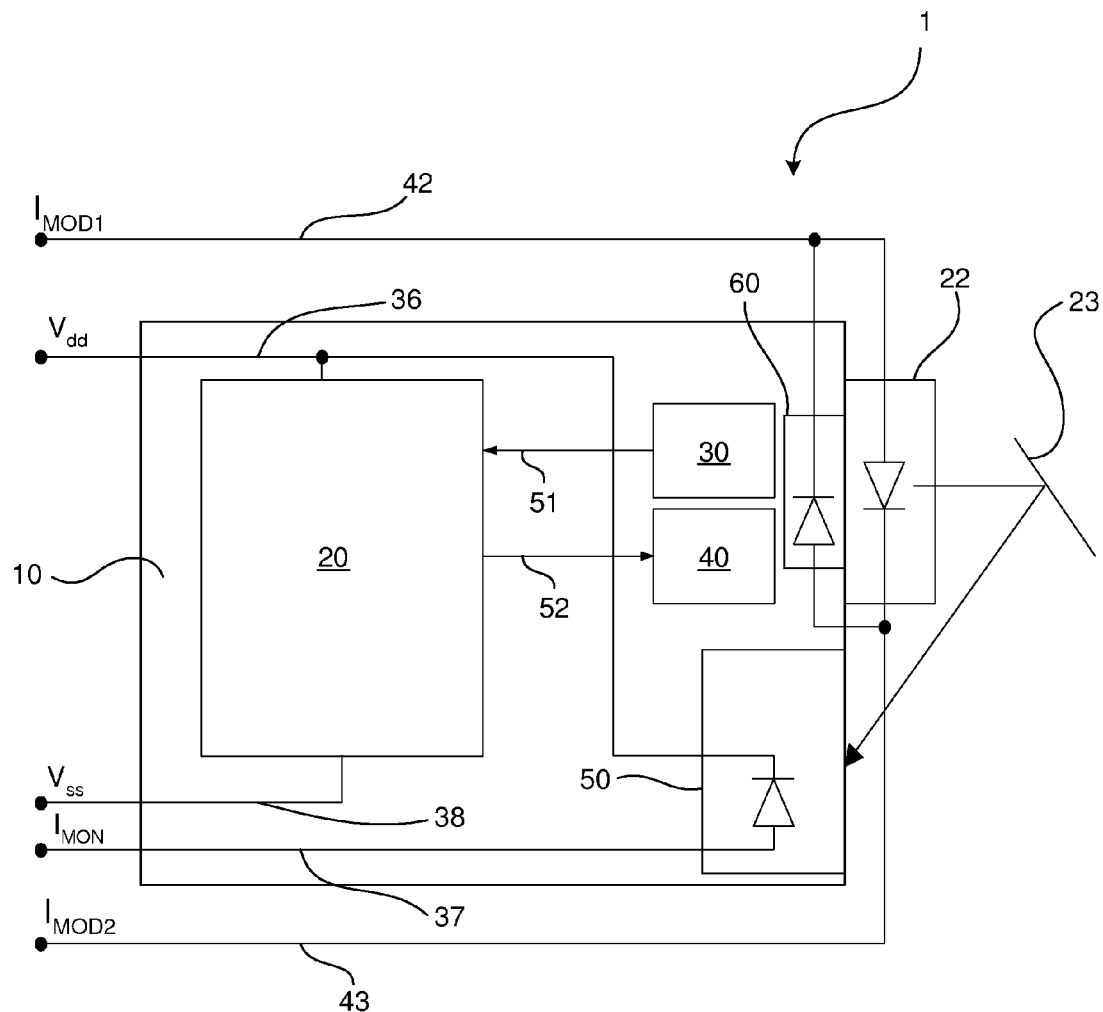
FIG. 1 illustrates a schematic diagram of a TOSA in accordance with an illustrative embodiment of the invention.

FIG. 1 illustrates a schematic diagram of the TOSA 1 in accordance with an illustrative embodiment of the invention. Like the typical low-cost TO-can TOSA described above, in accordance with this embodiment the TOSA 1 has a 5-pin count. The TOSA 1 includes a submount assembly substrate 10 that is die attached to the base of the TO-can (not shown). Unlike the low-cost TO-can TOSA described above, the submount assembly substrate 10 of the TOSA 1 has several components integrated into it, including at least a thermal controller 20, a temperature sensor 30, a heater 40, a monitor photodiode 50 and an ESD diode 60. A die 22 having a laser diode integrated therein is die attached to the substrate 10 and wire bonded to conductors or vias 42 and 43 on or in the substrate 10. An optics system 23 that is mounted on the submount assembly substrate 10 directs a portion of the light produced by the laser diode 22 onto the monitor photodiode 50. Thus, the only components of the TOSA 1 that are not integrated into the submount assembly substrate 10 are the laser diode die 22 and the optics system 23.

The pins labeled $I_{MOD1}$ and $I_{MOD2}$ are connected by conductors 42 and 43, respectively, to the anode and cathode, respectively, of the laser diode 22 and to the cathode and anode, respectively, of the ESD diode 60. These pins will typically be connected to a differential drive circuit (not shown) that is external to the TOSA 1 for differentially driving the laser diode 22 in accordance with an input data signal to modulate the laser diode 22. The pins labeled $V_{dd}$ and $V_{ss}$ are connected by conductors or vias 36 and 38, respectively, to the thermal controller 20. These pins provide a positive and a negative supply voltage to the thermal controller 20. The pins labeled $V_{dd}$ and $I_{MON}$ are connected by conductors or vias 36 and 37, respectively, to the cathode and anode, respectively, of the monitor photodiode 50. The pin labeled $V_{dd}$ provides the supply voltage to the monitor photodiode 50. The pin labeled $I_{MON}$ is for outputting the current produced by the monitor photodiode 50 to circuitry that is external to the TOSA 1.

Although not readily apparent from the schematic diagram shown in FIG. 1, the heater 40 is located underneath or beside the laser diode 22 in close proximity therewith. The thermal controller 20 receives temperature information via conductor 51 from the temperature sensor 30 and performs an algorithm that process the temperature information to determine whether or not the temperature of the heater 40 needs to be increased. If so, the thermal controller 20 sends a control signal on conductor 52 to the heater 40 that causes the heater 40 to increase its temperature, thereby increasing the temperature of the laser diode 22.

Figure 2:
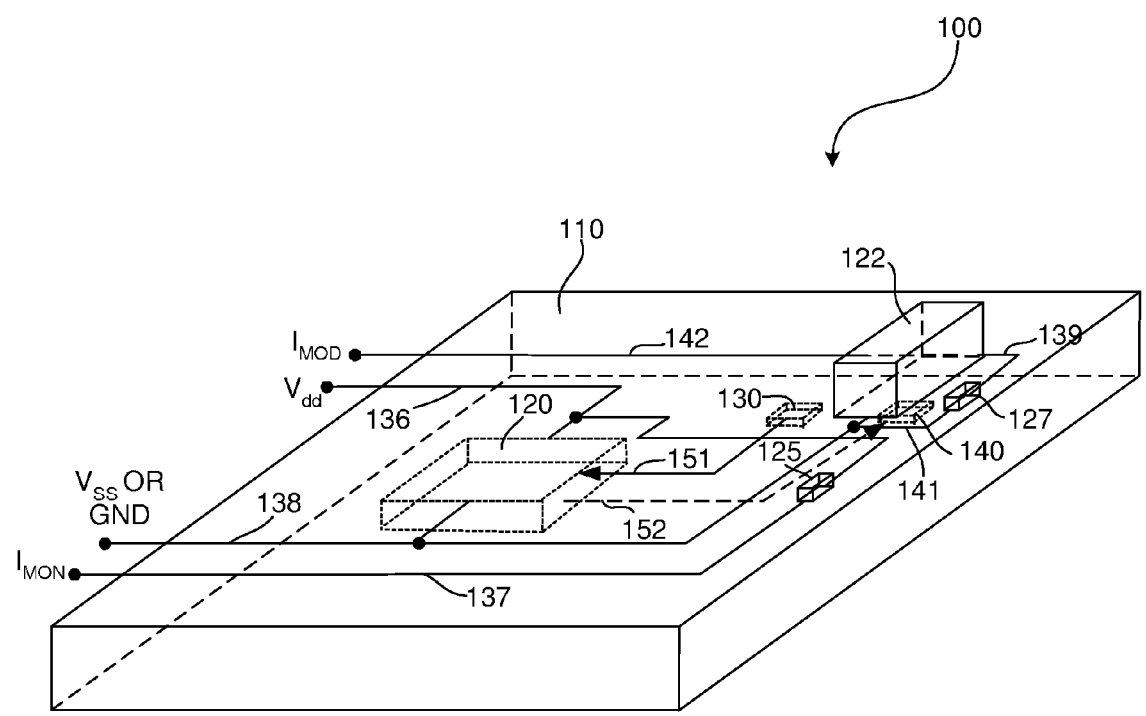
FIG. 2 illustrates a perspective block diagram of a TOSA in accordance with another illustrative embodiment of the invention.

FIG. 2 illustrates a block diagram of a TOSA 100 in accordance with another illustrative embodiment of the invention. In accordance with this embodiment, the TOSA 100 has a 4-pin count. The submount assembly substrate 110 of the TOSA 100 has several components integrated into it, including at least a thermal controller 120, a temperature sensor 130, and a heater 140. A die 122 having a laser diode integrated therein is die attached to the substrate 110 and wire bonded to conductors or vias 142 and 138 on or in the substrate 110. The pin labeled $I_{MOD}$ provides a modulation current, $I_{MOD}$, on conductor or via 142 to the anode of the laser diode 122 to modulate the laser diode 122 with bits that represent data, thereby causing the laser diode 22 to produce a modulated light beam. The cathode of the laser diode 122 is connected by the conductor or via 138 to the pin labeled $V_{ss}$ or GND. This is only one possible drive architecture. For example, as an alternative, the cathode could be connected to the pin labeled $I_{MOD}$ and the anode connected to the pin labeled $V_{ss}$ or GND.

In accordance with this embodiment, a discrete monitor photodiode 125 is wire bonded to conductors or vias 136 and 137 on the top surface of the substrate 110. The conductor or via 136 is connected to a pin labeled $V_{dd}$ and provides a supply voltage, $V_{dd}$, to the monitor photodiode 125. The conductor or via 137 is connected to a pin labeled $I_{MON}$. Alternatively, the monitor photodiode 125 may be connected between the pin labeled $I_{MON}$ and the pin labeled $V_{ss}$ or GND. The monitor photodiode 125 receives a portion of the light produced by the laser diode 122 and directed by one or more optical elements (not shown) onto the monitor photodiode 125. The monitor photodiode 125 produces an electrical current, $I_{MON}$, in response to the light received by the photodiode 125, which is output at the pin labeled $I_{MON}$. The pin labeled $V_{ss}$ or GND provides the negative supply voltage or ground potential to the thermal controller 120. The pin labeled $V_{dd}$ also provides the positive supply voltage to the thermal controller 120.

In accordance with this embodiment, a discrete ESD diode 127 is wire bonded to conductors or vias 139 and 141, which are connected to conductors or vias 142 and 138, respectively, such that the ESD diode 127 is in parallel with the laser diode 122. The ESD diode 127 provides ESD protection for the laser diode 122. Alternatively, the ESD diode 127 could be clipped to the pin labeled $I_{MOD}$ and the pin labeled Vss or GND and would provide the same ESD protection for the laser diode 122.

The integrated thermal controller 120 receives a signal on line 151 from the integrated temperature sensor 130 that indicates the temperature of the laser diode 122. The integrated temperature sensor 130 may be next to the laser diode 122 in close proximity therewith, or it may be underneath the laser diode in close proximity therewith. In FIG. 2, the integrated temperature sensor 130 is shown as being next to and in close proximity with the laser diode 122.

When the integrated thermal controller 120 receives a temperature indication on line 151 from the integrated temperature sensor 130, the controller 120 processes the temperature indication and determines whether the temperature of the laser diode 122 needs to be increased. If the controller 120 determines that the temperature of the laser diode 122 needs to be increased, the controller sends a signal on line 152 to the heater 140, which then heats the laser diode 122. Because the laser diode 122 is designed and manufactured to operate over a specific limited temperature range or at a particular temperature, the heater 140 only needs to be capable of providing relatively small increases in temperature as needed to maintain the temperature of the laser diode 122 above a desired minimum temperature or temperature range. Also, the laser diode 122 can be tuned for high temperature operation to optimize the operation of the laser diode 122. Because the laser diode 122 is designed and manufactured to operate over a specific limited temperature range or at a particular temperature, temperature testing during manufacturing can be limited to testing over this range or at this particular temperature, which reduces the time and cost associated with temperature testing.

Figure 3:
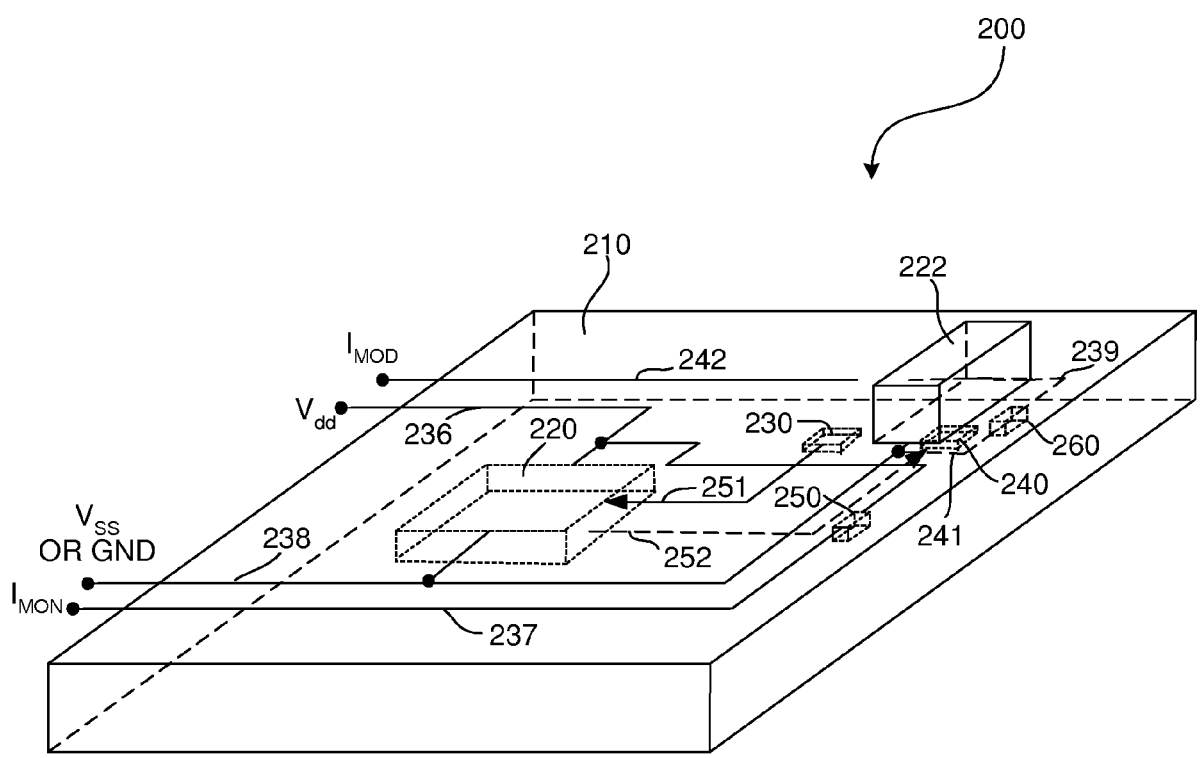
FIG. 3 illustrates a perspective block diagram of a TOSA in accordance with another illustrative embodiment of the invention.

FIG. 3 illustrates a block diagram of a TOSA 200 in accordance with another illustrative embodiment of the invention. The TOSA 200 has a 4-pin count. Unlike the typical known low-cost TO-can TOSA described above, the submount assembly substrate 210 of the TOSA 200 shown in FIG. 3 has several components integrated into it, including at least a thermal controller 220, a temperature sensor 230, a heater 240, a monitor photodiode 250 and an ESD diode 260. Thus, the only component shown in FIG. 3 that is not integrated into the submount assembly substrate 210 of the TOSA 200 is a die 222 having a laser diode integrated therein.

As with the laser diode die 122 described above with reference to FIG. 2, the laser diode die 222 shown in FIG. 3 is die attached to the substrate 210 and wire bonded to conductors or vias 242 and 238 that are on or in the substrate 210. The pin labeled $I_{MOD}$ provides a modulation current, $I_{MOD}$, on a conductor or via 242 to the anode of the laser diode 222 to modulate the laser diode 222 with bits that represent data. The cathode of the laser diode 222 is connected by the conductor or via 238 to the pin labeled $V_{ss}$ or GND. This is only one possible drive architecture. For example, alternatively, the cathode of the laser diode 222 could be connected to the pin labeled $I_{MOD}$ and the anode connected to $V_{ss}$ or GND.

In accordance with this embodiment, a monitor photodiode 250 is integrated into the submount assembly substrate 210 and is electrically connected to conductors or vias 236 and 237 on or in the substrate 110. The conductors or vias 236 and 237 are connected to the pins labeled $V_{dd}$ and $I_{MON}$, respectively, such that the anode of the monitor photodiode 250 is electrically coupled to the $I_{MON}$ pin and the cathode of the monitor photodiode 250 is electrically coupled to the $V_{dd}$ pin. Alternatively, the monitor photodiode 250 could be connected between the $I_{MON}$ pin and the pin labeled $V_{ss}$ or GND. The monitor photodiode 250 receives a portion of the light produced by the laser diode 222 that is directed by one or more optical elements (not shown) onto the monitor photodiode 250. The monitor photodiode 250 produces an electrical current, $I_{MON}$, in response to the light received by the photodiode 150, which propagates on conductor 237 to the pin labeled $I_{MON}$.

In accordance with this embodiment, an ESD diode 260 is also integrated into the submount assembly substrate 210 and is electrically connected by conductors or vias 238, 239, 241, and 242 such that the ESD diode 260 is electrically in parallel with the laser diode 222.

The integrated thermal controller 220 receives a signal on line 251 from the integrated temperature sensor 230 that indicates the temperature of the laser diode 222. The integrated temperature sensor 230 may be next to the laser diode1 222 in close proximity therewith, or it may be underneath the laser diode 222 in close proximity therewith. In FIG. 3, the integrated temperature sensor 230 is shown as being next to and in close proximity with the laser diode 222. Likewise, the integrated heater 240 may be next to the laser diode1 222 in close proximity therewith, or it may be underneath the laser diode 222 in close proximity therewith. In FIG. 3, the integrated heater 240 is shown as being underneath and in close proximity with the laser diode 222.

When the integrated thermal controller 220 receives a temperature indication on line 251 from the integrated temperature sensor 230, the controller 220 processes the temperature indication and determines whether the temperature of the laser diode 222 needs to be increased. If the controller 220 determines that the temperature of the laser diode 222 needs to be increased, the controller sends a signal on line 252 to the heater 240, which then heats the laser diode 222. This process of measuring the temperature of the laser diode 222 and, if necessary, causing the heater 240 to heat the laser diode 222 is performed until the controller 220 determines that the laser diode 222 is at the appropriate temperature.

Because the laser diode 222 is designed and manufactured to operate over a very limited temperature range or at a particular temperature, the heater 240 only needs to be capable of providing relatively small increases in temperature as needed to maintain the temperature of the laser diode at a desired temperature or temperature range. Also, the laser diode 222 can be tuned for high temperature operation to optimize the operation of the laser diode 222. Because the laser diode 222 is designed and manufactured to operate over a very limited temperature range or at a particular temperature, temperature testing during manufacturing can be limited to testing over this range or at this particular temperature, which reduces the time and cost associated with temperature testing.

Figure 4:
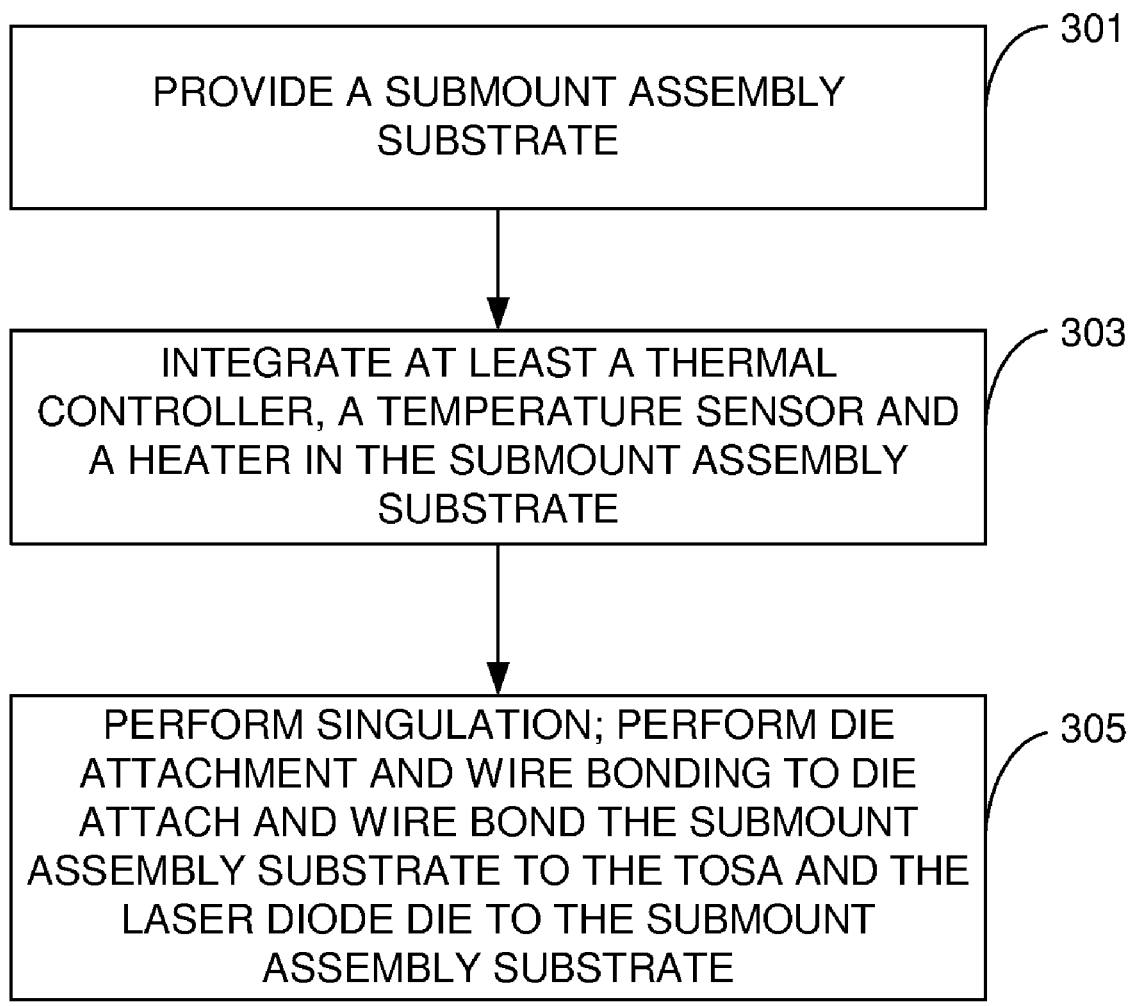
FIG. 4 illustrates the method in accordance with an embodiment for fabricating the TOSA.

FIG. 4 illustrates the method in accordance with an embodiment for fabricating the TOSA. A submount assembly substrate is provided, as indicated by block 301. This is typically manufactured in a wafer form comprising a suitable material, such as silicon, for example. At the wafer level, processes are performed to integrate a thermal controller, a temperature sensor and a heater into the substrate, as indicated by block 303. Once these components and any other components that need to be integrated into the substrate at the wafer level have been integrated into the substrate and singulated into die, a die attach process and wire bonding process are performed. During this process, the submount assembly substrate is die attached and wire bonded to the TO-can base and the laser diode die is die attached and wire bonded to the submount assembly substrate die, as indicated by block 305. Other components may also be die attached and wire bonded to the substrate at this time.

After all of the components have been die attached and wire bonded to the substrate, the TOSA is typically subjected to various other processes, such as, for example, attaching one or more optical components to the substrate, hermetically sealing a cap or lid to the TO-can base on which the submount assembly substrate is mounted so that the components are in a hermetically-sealed environment, etc. Other steps, such as, for example, trimming of the temperature sensor and heater and programming of the thermal controller, if necessary, may be performed at the wafer level prior to singulation using one-time programmable (OTP) memory or fuses. Alternatively, this could be done after singulation has been performed using bond wire programmability if area is available on the submount assemblies for extra pads.

Figure 5:
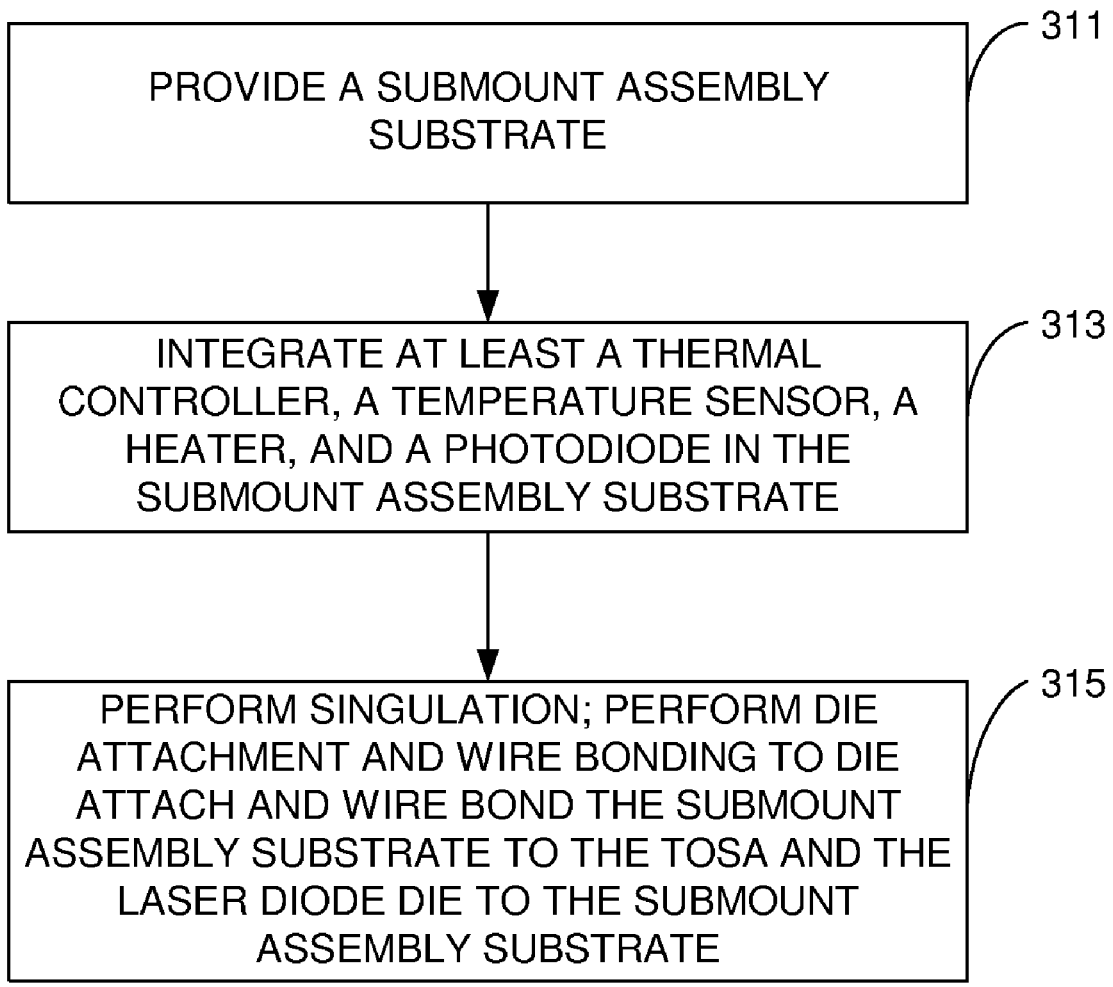
FIG. 5 illustrates the method in accordance with another illustrative embodiment for fabricating the TOSA.

FIG. 5 illustrates the method in accordance with another illustrative embodiment for fabricating the TOSA. A submount assembly substrate is provided, as indicated by block 311. At the wafer level, standard IC processes are performed to integrate a thermal controller, a temperature sensor, a heater and a monitor photodiode into the substrate, as indicated by block 313. Because the photodiode is also being integrated into the substrate, the material comprising the wafer must be a suitable material for forming a photodiode that is capable of detecting the wavelength of light produced by the laser. Silicon, for example, is a suitable material for this purpose. Once these components and any other components that need to be integrated into the substrate at the wafer level have been integrated into the substrate, the processes of singulation, die attachment and wire bonding are performed. During these processes, the submount assembly substrate is die attached and wire bonded to the TO-can base and the laser diode die is die attached and wire bonded to the submount assembly substrate die, as indicated by block 315. Thus, the method may be identical to the method described above with reference to FIG. 4 except that the photodiode is integrated into the submount assembly substrate in the embodiment illustrated in FIG. 5. Optionally, an ESD diode may also be integrated into the submount assembly substrate, as described above with reference to FIG. 3.

Figure 6:
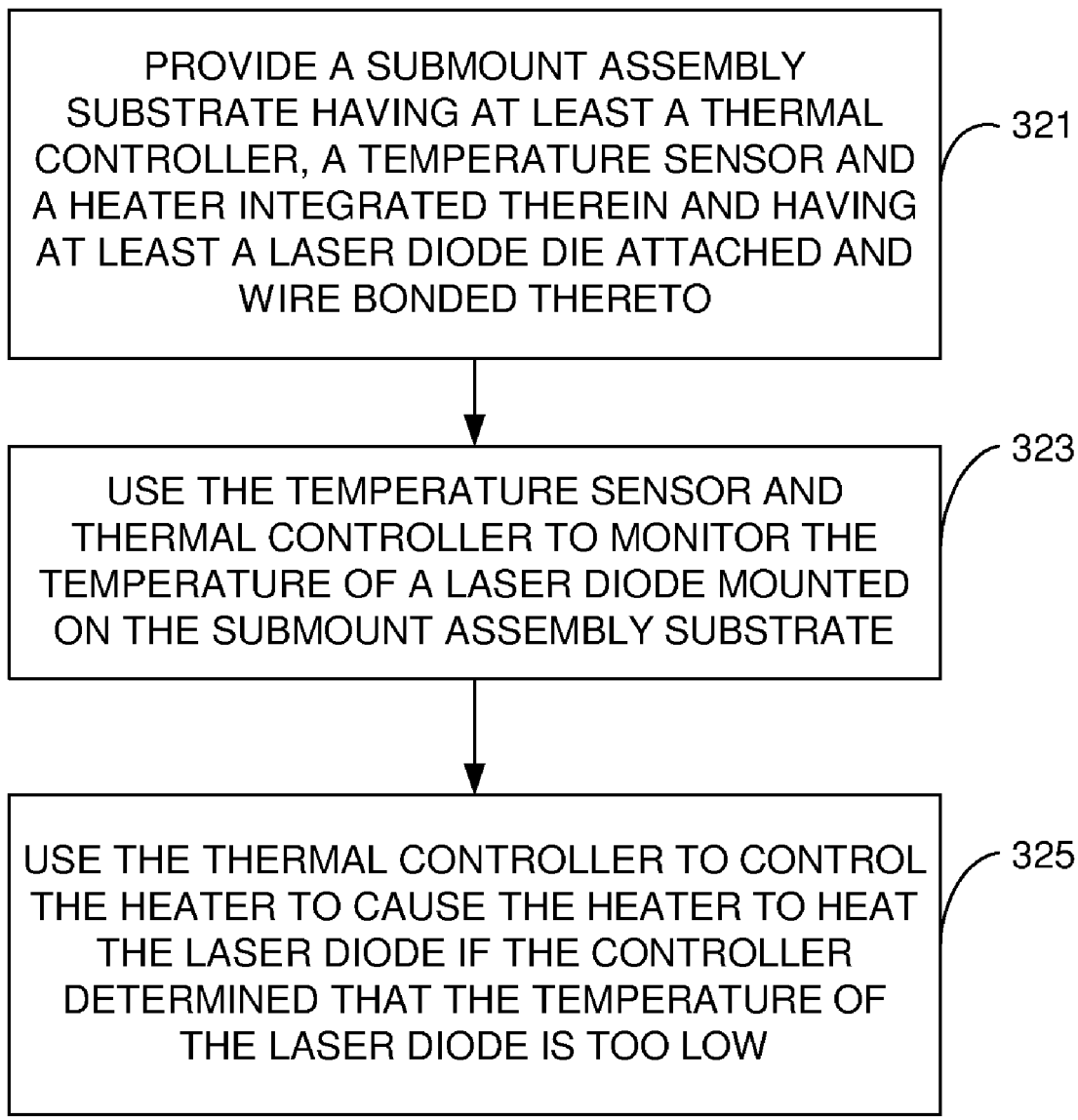
FIG. 6 illustrates a flowchart that represents the method of the invention for monitoring the temperature of the laser diode in a TO-can TOSA and adjusting the temperature of the laser diode as needed.

FIG. 6 illustrates a flowchart that represents the method of the invention for monitoring the temperature of the laser diode in a TO-can TOSA of the type described above and adjusting the temperature of the laser diode as needed. A submount assembly substrate is provided having at least a thermal controller, a temperature sensor, and a heater integrated therein and having a laser diode die attached and wire bonded thereto, as indicated by block 321. The temperature sensor and thermal controller are then used to monitor the temperature of the laser diode, as indicated by block 323. The thermal controller then adjusts the temperature of the laser diode by heating the heater, as indicated by block 325.

It should be noted that the invention has been described with reference to particular embodiments and that the invention is not limited to the embodiments described herein. For example, FIGS. 1-3 show particular components integrated into or mounted on the submount assembly substrate in a particular layout. Additional components may be integrated into and/or mounted on the substrate if desired or necessary. The invention is not limited to the components that are integrated into or mounted on the substrate. The invention also is not limited to any particular layout for integrating components into and/or mounting components on the substrate. The invention also is not limited to the materials used for the substrate or the components mounted thereon or integrated therein, nor is the invention limited to the processes that are used to make the TOSA. The invention also is not limited with respect to the number of pins that are included in the TOSA, although the invention is intended to provide additional functionality without the necessity of increasing the pin count. Those skilled in the art will understand that other variations and modifications may be made to the embodiments described herein and that all such modifications or variations are within the scope of the invention.

What is claimed is:

1. A transmitter optical subassembly (TOSA) comprising:
   a submount assembly substrate, the substrate comprising one or more surfaces, and a plurality of conductors disposed on or in said substrate;
   a plurality of electrically conductive pins, each pin being electrically coupled to one of said plurality of conductors;
   a thermal controller integrated in said substrate;
   a temperature sensor integrated in said substrate;
   a heater integrated into said substrate, at least one of said plurality of conductors being electrically coupled to said thermal controller and to said temperature sensor, at least one of said plurality of conductors being electrically coupled to said thermal controller and to said heater, at least one of said plurality of conductors being electrically coupled to one of said pins and to said thermal controller;

a laser diode die mounted on the substrate, the laser diode die having one or more conductors that are electrically coupled to one or more of said plurality of conductors of said substrate, the heater being in close proximity to the laser diode to allow the heater to heat the laser diode based on determinations made by the thermal controller; and a monitor photodiode mounted on or integrated in the substrate, the monitor photodiode having one or more conductors that are electrically coupled to one or more of said plurality of conductors of said substrate, wherein the sub mount assembly includes five or less electrically conductive pins, each pin being electrically coupled to a respective one of said plurality of conductors, wherein said five or less electrically conductive pins of the submount assembly includes at least first, second, third, fourth, and fifth electrically conductive pins, wherein the first electrically conductive pin provides a modulation current to the laser diode die, wherein the second electrically conductive pin provides a positive supply voltage, Vdd, to one or more components integrated in or mounted on the substrate including the thermal controller, wherein the third electrically conductive pin provides ground potential to one or more components integrated in or mounted on the substrate including the laser diode die, wherein the fourth electrically conductive pin receives a monitoring current from the monitor photodiode, and wherein the fifth electrically conductive pin provides a negative supply voltage, Vss, to one or more components integrated in or mounted on the substrate including the thermal controller.

2. The TOSA of claim 1, wherein the monitor photodiode is integrated in the substrate.

3. The TOSA of claim 1, further comprising an electrostatic discharge (ESD) diode mounted on or integrated in the substrate, the ESD diode having one or more conductors that are connected to one or more of said plurality of conductors of the substrate such that the ESD diode is electrically connected to in parallel with the laser diode.

4. The TOSA of claim 3, wherein the ESD diode is integrated in the substrate.

5. The TOSA of claim 4, wherein the monitor photodiode is integrated in the substrate.

6. A method for controlling the temperature of a laser diode in a transmitter optical submount assembly (TOSA), the method comprising:

providing a submount assembly substrate having at least a thermal controller, a temperature sensor and a heater integrated therein, the substrate having a laser diode die attached and wire bonded to a surface of the substrate, the heater being in close proximity to the laser diode die;

using the temperature sensor and thermal controller to monitor a temperature of the laser diode die;

using the thermal controller to control the heater to cause the heater to heat the laser diode die if the thermal controller determines that the temperature of the laser diode die is too low, wherein the TOSA has, at most, five electrically conductive pins for inputting signals to or outputting signals from the TOSA; and electrically coupling each pin to a respective one of said plurality of conductors, wherein said five electrically conductive pins of the submount assembly includes at least first, second, third, fourth, and fifth electrically conductive pins, wherein the first electrically conductive pin provides a modulation current to the laser diode die, wherein the second electrically conductive pin provides a positive supply voltage, Vdd, to one or more components integrated in or mounted on the substrate including the thermal controller, wherein the third electrically conductive pin provides ground potential to one or more components integrated in or mounted on the substrate including the laser diode die, wherein the fourth electrically conductive pin receives a monitoring current from the monitor photodiode, and wherein the fifth electrically conductive pin provides a negative supply voltage, Vss, to one or more components integrated in or mounted on the substrate including the thermal controller.

7. The method of claim 6, wherein the submount assembly substrate provided also has a monitor photodiode integrated therein.

8. The method of claim 1, wherein the submount assembly substrate provided also has a monitor photodiode mounted on and electrically connected to one or more conductors formed on or it the substrate.

9. A method for controlling the temperature of a laser diode in a transmitter optical submount assembly (TOSA), the method comprising:

providing a submount assembly substrate having at least a thermal controller, a temperature sensor and a heater integrated therein, the substrate having a laser diode die attached and wire bonded to a surface of the substrate, the heater being in close proximity to the laser diode die;

using the temperature sensor and thermal controller to monitor a temperature of the laser diode die;

using the thermal controller to control the heater to cause the heater to heat the laser diode die if the thermal controller determines that the temperature of the laser diode die is too low, wherein the TOSA has, at most, five electrically conductive pins for inputting signals to or outputting signals from the TOSA; and electrically coupling each pin to a respective one of said plurality of conductors, wherein said five electrically conductive pins of the submount assembly includes at least first, second, third, fourth, and fifth electrically conductive pins, wherein the first electrically conductive pin provides a modulation current to the laser diode die, wherein the second electrically conductive pin provides a positive supply voltage, Vdd, to one or more components integrated in or mounted on the substrate including the thermal controller, wherein the third electrically conductive pin provides ground potential to one or more components integrated in or mounted on the substrate including the laser diode die, wherein the fourth electrically conductive pin receives a monitoring current from the monitor photodiode, and wherein the fifth electrically conductive pin provides a negative supply voltage, Vss, to one or more components integrated in or mounted on the substrate including the thermal controller.

10. The method of claim 9, further comprising providing the submount assembly with a monitor photodiode.

* * * * *